United States Patent
Mi et al.

(10) Patent No.: US 8,031,459 B2
(45) Date of Patent: Oct. 4, 2011

(54) MOVABLE MICRO-DEVICE

(75) Inventors: Xiaoyu Mi, Kawasaki (JP); Takeaki Shimanouchi, Kawasaki (JP); Masahiko Imai, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 313 days.

(21) Appl. No.: 12/071,746

(22) Filed: Feb. 26, 2008

(65) Prior Publication Data
US 2008/0218933 A1 Sep. 11, 2008

(30) Foreign Application Priority Data
Feb. 26, 2007 (JP) .................................. 2007-045578

(51) Int. Cl.
*H01G 5/01* (2006.01)
*H01G 5/04* (2006.01)
*H01G 7/00* (2006.01)
(52) U.S. Cl. ..................... 361/278; 361/292; 361/280
(58) Field of Classification Search .................. 361/278, 361/292, 283.2, 281, 280
See application file for complete search history.

(56) References Cited

U.S. PATENT DOCUMENTS

| | | | | |
|---|---|---|---|---|
| 4,711,128 A * | 12/1987 | Boura | ........................ | 73/514.18 |
| 5,959,516 A | 9/1999 | Chang et al. | | |
| 6,355,534 B1 | 3/2002 | Cheng et al. | | |
| 6,700,299 B2 | 3/2004 | Quenzer et al. | | |
| 6,966,225 B1 * | 11/2005 | Mallary | ..................... | 73/514.32 |
| 7,085,122 B2 * | 8/2006 | Wu et al. | ........................ | 361/277 |
| 7,329,930 B2 * | 2/2008 | Hung | ............................. | 257/414 |
| 7,476,950 B2 | 1/2009 | Kouma et al. | .................. | 257/415 |
| 2004/0229440 A1 * | 11/2004 | Kim et al. | ...................... | 438/400 |
| 2005/0013087 A1 | 1/2005 | Wu et al. | | |
| 2006/0067840 A1 | 3/2006 | Kawakubo et al. | | |
| 2006/0268383 A1 * | 11/2006 | Cho et al. | ...................... | 359/223 |

FOREIGN PATENT DOCUMENTS

| | | |
|---|---|---|
| CN | 1821830 A | 8/2006 |
| JP | 2002-373829 | 12/2002 |
| JP | 2004-505788 | 2/2004 |
| JP | 2006-93463 | 4/2006 |

OTHER PUBLICATIONS

Office Action dated Nov. 23, 2009 corresponding to Korean Patent Application.
C. Goldsmith, et al; "Lifetime Characterization of Capacitive RF MEMS Switches;" *IEEE MTT-S Digest*; 2001; pp. 227-230 (4 Sheets.).

(Continued)

*Primary Examiner* — Eric Thomas
*Assistant Examiner* — David M Sinclair
(74) *Attorney, Agent, or Firm* — Fujitsu Patent Center

(57) ABSTRACT

A micro-device includes a movable part, a frame and a connecting part. The movable part has a main portion, a first capacitor electrode and a first driver electrode. The capacitor electrode and the driver electrode have electrode teeth extending from the main portion. The frame includes second capacitor and driver electrodes, where the second capacitor electrode has electrode teeth extending toward the first capacitor electrode, and the second driver electrode has electrode teeth extending toward the first driver electrode. The connecting part connects the movable part to the frame. The first and second capacitor electrodes have their electrode teeth overlapped in their initial position. The movable part is rotatable for varying the extent of the overlapping between the first and second driver electrodes.

13 Claims, 18 Drawing Sheets

OTHER PUBLICATIONS

S. Mellé, et al.; Modeling of the dielectric charging kinetic for capacitive RF-MEMS; *IEEE MTT-S Digest*; 2005; pp. 757-760 (4 Sheets.).

C. Tsai, et al.; "An Isolated Tunable Capacitor with a Linear Capacitance-Voltage Behavior;" *Transducers '03 Digest*; Jun. 8-12, 2003; pp. 833-836 (4 Sheets.).

P. Monajemi, et al.; "A High-Q Low-Voltage HARPSS Tunable Capacitor;" *IEEE MTT-S Digest*; 2005; pp. 749-752 (4 Sheets.).

H. Nguyen; "A Novel MEMS Tunable Capacitor Based on Angular Vertical Comb Drive Actuators;" *Solid-State Sensor, Actuator and Microsystems Workshop*; Hilton Head Island, South Carolina; Jun. 2-6, 2002; pp. 277-280 (4 Sheets.).

Office Action dated Mar. 10, 2010 corresponding to Chinese Patent application No. 200810081333.6.

* cited by examiner (a)

(b)

(c)

(d)

(a)

(b)

(c)

MOVABLE MICRO-DEVICE

BACKGROUND OF THE INVENTION

1. Field of the Invention

The present invention relates to movable micro-devices such as variable micro-capacitors and micro sensing devices which are manufactured by micromachining technology and have tiny movable parts.

2. Description of the Related Art

In recent years, movable micro-devices which are manufactured by micromachining technology have been drawing attention in various technical fields, and efforts have been made for application of these devices which have a microstructure. Micro devices include such devices as variable micro-capacitors and micro sensing devices which have tiny movable parts or oscillating parts. Movable micro-devices are disclosed in the following Patent Documents 1 through 3, for example.

Patent Document 1: JP-A-2002-373829
Patent Document 2: JP-A-2004-505788
Patent Document 3: U.S. Pat. No. 5,959,516

FIG. 16 through FIG. 19 show a variable micro-capacitor X4 as an example of conventional movable micro-device. FIG. 16 is a plan view of the variable micro-capacitor X4. FIG. 17 is another plan view of the variable micro-capacitor X4. FIG. 18 and FIG. 19 are sectional views taken along lines XVIII-XVIII and XIX-XIX respectively, in FIG. 16.

The variable micro-capacitor X4 includes a movable part 40, a frame 50 and a pair of connecting parts 60. The variable micro-capacitor X4 is manufactured by micromachining technology such as MEMS technology, from a so called SOI (silicon on insulator) material substrate. The material substrate has a laminate structure including a first and a second silicon layer, and an insulation layer between the silicon layers. Each of the silicon layers is doped with impurity and has a predetermined level of electrical conductivity. FIG. 16 is a plan view intended primarily to clarify a structure formed from the first silicon layer. For the sake of clarification, those portions formed from the first silicon layer are hatched in FIG. 16. In FIG. 17, portions formed from the second silicon layer are hatched.

The movable part 40 is formed entirely from the first silicon layer, has a movable main portion 41 and comb-teeth electrodes 42, 43, and is swingable or rotatable with respect to the frame 50. The comb-teeth electrode 42 is provided by a plurality of electrode teeth 42a which extend from the movable main portion 41. The comb-teeth electrode 43 is provided by a plurality of electrode teeth 43a which extend from the movable main portion 41.

The frame 50 includes a frame main portion 51 and comb-teeth electrodes 52, 53. The frame main portion 51, which has a laminate structure including the above-described first and the second silicon layers and the insulation layer between the silicon layers, surrounds the movable part 40. The comb-teeth electrodes 52 is provided by a plurality of electrode teeth 52a which extends from the frame main portion 51. The comb-teeth electrode 53 is provided by a plurality of electrode teeth 53a which extends from the frame main portion 51. The frame main portion 51 is formed with a gap 51a at a predetermined location in the portion which is formed from the first and the second silicon layers. Because of the gap 51a and the insulation layer between the silicon layers, the comb-teeth electrodes 42, 43 are electrically separated from the comb-teeth electrodes 52, 53, and the comb-teeth electrode 52 is electrically separated from the comb-teeth electrode 53 in the frame 50.

The comb-teeth electrode 42 of the movable part 40 and the comb-teeth electrode 52 of the frame 50 constitute a pair of capacitor electrodes in the variable micro-capacitor X4. In an initial position, electrode teeth 42a of the comb-teeth electrode 42 and electrode teeth 52a of the comb-teeth electrodes 52 have their side surfaces opposed to each other.

The comb-teeth electrode 43 of the movable part 40 and the comb-teeth electrode 53 of the frame 50 constitute a pair of driver electrodes in the variable micro-capacitor X4. The comb-teeth electrode 43 is formed from the first silicon layer whereas the comb-teeth electrode 53 is formed from the second silicon layer.

Each connecting part 60 connects the movable part 40 and the frame 50. The pair of connecting parts 60 define an axis A4 for rotational displacement of the movable part 40 with respect to the frame 50. Also, each connecting part 60 electrically connects part of the frame main portion 51 with the movable part 40. The movable part 40 which has the comb-teeth electrodes 42, 43 is grounded via the connecting part 60.

FIG. 20 and FIG. 21 show a method for manufacturing the variable micro-capacitor X4. FIG. 20 and FIG. 21 show a sectional view in series, following steps of forming the movable main portion 41, the comb-teeth electrodes 42, 43, the frame main portion 51, the comb-teeth electrodes 52, 53, and the connecting part 60. The section shown in the views is a conceptual composite representing various portions from different sections of the material substrate (wafer) to which micromachining is performed.

In the manufacture of the variable capacitor X4, first, a material substrate 300 as shown in FIG. 20(a) is prepared. The material substrate 300 is a so called SOI, and has a laminate structure including silicon layers 301, 302, and an insulation layer 303 between the silicon layers.

Next, as shown in FIG. 20(b), a resist pattern 304 is formed on the silicon layer 301. The resist pattern 304 provides a pattern for portions to be formed from the silicon layer 301 in the variable micro-capacitor X4.

Next, as shown in FIG. 20(c), a resist pattern 305 is formed on the silicon layer 302. The resist pattern 305 provides a pattern for portions to be formed from the silicon layer 302 in the variable micro-capacitor X4.

Next, as shown in FIG. 21(a), anisotropic dry etching is performed to the silicon layer 301, using the resist pattern 304 as a mask, whereby formation is made for the movable main portion 41, the comb-teeth electrodes 42 or electrode teeth 42a, the comb-teeth electrode 43 or electrode teeth 43a, part of the frame main portion 51, the comb-teeth electrodes 52 or electrode teeth 52a and the connecting part 60.

Next, as shown in FIG. 21(b), anisotropic dry etching is performed to the silicon layer 302, using the resist pattern 305 as a mask, whereby formation is made for part of the frame main portion 51 and the comb-teeth electrode 53 or electrode teeth 53a.

Next, as shown in FIG. 21(c), resist patterns 304, 305 are removed, and exposed portions of the insulation layer 303 are removed. Through these steps, it is possible to manufacture the variable micro-capacitor X4.

In the variable micro-capacitor X4, it is possible to rock or rotationally displace the movable part 40 about the axis A4 as necessary, by applying a predetermined electric potential to the comb-teeth electrode 53. As the predetermined electric potential is applied to the comb-teeth electrode 53, a predetermined electrostatic attraction is generated between the comb-teeth electrodes 43, 53 (Note that the comb-teeth electrode 43 is grounded in the present example), and therefore the comb-teeth electrode 43 is drawn toward the comb-teeth electrode 53. As a result, the movable part 40 rocks about the axis A4, and makes a rotational displacement to an angle at which the electrostatic attraction is counterbalanced by a sum of torsional stresses in the connecting parts 60. The amount of rotational displacement caused by such a rocking operation is adjustable through adjustment of the electric potential applied to the comb-teeth electrode 53 (The adjustment on the amount of rotational displacement may be made by controlling the electric potential difference between the comb-teeth electrodes 43, 53, without grounding the comb-teeth electrode 43). Through the adjustment on the amount of rotational displacement, it is possible to adjust the amount of opposed area between the comb-teeth electrodes 42, 52 (the area of side surfaces via which the electrode teeth 42a and the electrode teeth 52a oppose to each other), and therefore it is possible to adjust the electrostatic capacity between the comb-teeth electrodes 42, 52 which serve as the capacitor electrodes. On the other hand, if the electrostatic attraction between the comb-teeth electrodes 43, 53 is removed, each connecting part 60 releases the torsional stresses held therein, to return to its natural state, allowing the movable part 40 or comb-teeth electrodes 42 to return to its initial position.

Generally, a capacitor device whose capacitor electrodes have a small resistance tends to have a high Q-value in the capacitor device. However, in the conventional variable micro-capacitor X4 which is manufactured by the above-described method from an SOI substrate, the pair of capacitor electrodes (comb-teeth electrodes 42, 52) are made of an electroconductive silicon material, and the electroconductive silicon material generally has a higher resistivity than e.g. a metal material. For this reason, it is sometimes impossible to achieve a sufficiently high Q-value in the variable micro-capacitor X4 (movable micro-device)

SUMMARY OF THE INVENTION

The present invention has been proposed under the above-described circumstances, and it is therefore an object of the present invention to provide a movable micro-device suitable for achieving a high Q-value.

A first aspect of the present invention provides a movable micro-device which includes a movable part, a frame and a connecting part as follows: The movable part in the present device has a movable main portion, a first capacitor comb-teeth electrode having a plurality of electrode teeth extending from the movable main portion, and a first driver comb-teeth electrode having a plurality of electrode teeth extending from the movable main portion. The frame has a second capacitor comb-teeth electrode having a plurality of electrode teeth extending toward the first capacitor comb-teeth electrode of the movable part, and a second driver comb-teeth electrode having a plurality of electrode teeth extending toward the first driver comb-teeth electrode. The connecting part connects the movable part and the frame. The first and the second capacitor comb-teeth electrodes are made of metal material, and have electrode teeth overlap when residing at their initial position. The first and the second driver comb-teeth electrodes are made within the same material layer, and do not have electrode teeth overlap when residing at their initial position, or do have electrode teeth overlap when residing at their initial position. The movable part is rotatably displaceable for providing the electrode teeth overlap between the first and the second driver comb-teeth electrodes and to vary an extent of the electrode teeth overlap between the first and the second driver comb-teeth electrodes. The electrode teeth overlap in the present invention means that in a pair of comb-teeth electrodes (a pair of capacitor comb-teeth electrodes or a pair of driver comb-teeth electrodes), electrode teeth in one of the comb-teeth electrodes reside between electrode teeth in the other of the comb-teeth electrodes, so that the electrode teeth in one of the comb-teeth electrodes and the electrode teeth in the other of the comb-teeth electrodes have their side surfaces opposed to each other.

The present movable micro-device includes, as a pair of capacitor electrodes, the first and the second capacitor comb-teeth electrodes made of metal material. Metal material generally has a lower resistivity than silicon material. Therefore, the present movable micro-device is more suitable for achieving a higher Q-value than e.g. the conventional variable micro-capacitor X4 in which the capacitor element is provided by a pair of capacitor electrodes which are made of an electroconductive silicon material.

In addition, the present movable micro-device is suitable for generating a large driving force between a pair of driver electrodes which are provided by the first and the second driver comb-teeth electrodes. The reason for this is as follows:

In the above-described manufacturing process for the conventional variable micro-capacitor X4, the comb-teeth electrode 43 which is one member of a pair of driver electrodes and the comb-teeth electrode 53 which is the other member of the pair of driver electrodes are formed in different layers (silicon layers 301, 302) in the SOI substrate, i.e. the material substrate 300. Specifically, as has been described with reference to FIG. 21(a), the comb-teeth electrode 43 is formed by anisotropic etching performed to the silicon layer 301, using the resist pattern 304 as a mask. The comb-teeth electrode 53 is formed, as has been described with reference to FIG. 21(b), by anisotropic etching performed to the silicon layer 302, using the resist pattern 305 as a mask. The resist pattern 304 which includes a mask for the comb-teeth electrode 43 is formed on the silicon layer 301 whereas the resist pattern 305 which includes a mask for the comb-teeth electrode 53 is formed on the silicon layer 302 which is a side away from the silicon layer 301 in the material substrate 300. The resist patterns 304, 305 formed on surfaces which are facing away from each other as described above do not have a high level of accuracy in terms of their relative location for formation, i.e. their alignment accuracy is relatively low. A lower alignment accuracy between the resist patterns 304, 305 results in a lower positional accuracy of the comb-teeth electrode 43, 53 which are formed by using part of the resist patterns 304, 305 as masks (For example, with the location where the comb-teeth electrode 43 is formed being a reference position, the location where the comb-teeth electrode 53 is formed is not accurate). This makes it difficult to design a small gap between the comb-teeth electrodes 43, 53 for the sate of electrode teeth overlap between the electrode teeth 43a, 53a (In order to avoid a problem called pull-in phenomenon between the comb-teeth electrodes 43, 53 with a smaller gap between the electrode teeth 43a, 53a, higher accuracy must be achieved in terms of location where the comb-teeth electrodes 43, 53 are formed). In order to generate a large electrostatic attraction (driving force) between a pair of comb-teeth electrodes, it is effective to design so that the gap between the electrode teeth of the comb-teeth electrodes in the state of electrode teeth overlap is small. However, with relatively low alignment accuracy between the resist patterns 304, 305 in the manufacturing process, it is generally difficult in the variable micro-capacitor X4 to design the gap so small between the electrode teeth 43a, 53a of the comb-teeth electrodes 43, 53 for the state of electrode teeth overlap. Therefore, the conventional variable micro-capacitor X4 has a difficulty in generating a large electrostatic attraction (driving force) between a pair of driver comb-teeth electrode 43, 53.

On the other hand, a pair of driver electrodes in the present movable micro-device-which are provided by the first and the second driver comb-teeth electrode are made in the same material layer. Therefore, a mask for the first driver comb-teeth electrode or the first mask pattern including the mask, and a mask for the second driver comb-teeth electrode or the second mask pattern including the mask can be formed on the same surface of the material layer, and the two electrodes can be shaped by e.g. anisotropic etching performed to the material layer, using these mask patterns. The first and the second mask patterns which are formed on the same surface of the material layer can have relatively high alignment accuracy. If the first and the second mask patterns are included in the same single mask pattern formed on the same surface of a material layer, formation of the first and the second mask patterns can be achieved by the same lithographic operation without any alignment error, theoretically, concerning the first and the second mask patterns. Use of the first and the second mask patterns as described above enables to form the first and the second driver comb-teeth electrodes which have high relative positional accuracy, making it easy to design the gap as small between the electrode teeth for the state of electrode teeth overlap between the first and the second driver comb-teeth electrode.

Therefore, the present movable micro-device is suitable for generating a large driving force between a pair of driver electrodes which are provided by the first and the second driver comb-teeth electrodes. The present movable micro-device as described above is suitable for decreasing a driving voltage to be applied to the pair of driver electrodes (the first and the second driver comb-teeth electrodes).

Preferably, the first and the second driver comb-teeth electrodes are made in the same material layer provided by an electroconductive silicon material. Preferably, the first and the second driver comb-teeth electrodes are formed simultaneously by a DRIE (Deep Reactive Ion Etching) operation performed to the material layer. These arrangements are suitable for forming the first and the second driver comb-teeth electrodes accurately.

Preferably, the first and/or the second capacitor comb-teeth electrode contains a metal selected from a group consisting of Au, Ag, Cu and Al. Preferably, the first and/or the second capacitor comb-teeth electrode is formed by electroplating. These arrangements are suitable for forming the first and/or the second capacitor comb-teeth electrode of a small resistivity.

A second aspect of the present invention provides a movable micro-device which includes a movable part, a frame and a connecting part as follows: The movable part in the present device has a movable main portion, a first capacitor comb-teeth electrode having a plurality of electrode teeth extending from the movable main portion, and a first driver comb-teeth electrode having a plurality of electrode teeth extending from the movable main portion. The frame has a second capacitor comb-teeth electrode having a plurality of electrode teeth extending toward the first capacitor comb-teeth electrode, and a second driver comb-teeth electrode having a plurality of electrode teeth extending toward the first driver comb-teeth electrode. The connecting part connects the movable part and the frame. The first and the second capacitor comb-teeth electrodes are made of metal material, and have electrode teeth overlap when residing at their initial position. The first and the second driver comb-teeth electrodes are made of metal material, and do not have electrode teeth overlap when residing at their initial position, or do have electrode teeth overlap when residing at their initial position. The movable part is rotatably displaceable for providing the electrode teeth overlap between the first and the second driver comb-teeth electrodes and to vary an extent of the electrode teeth overlap between the first and the second driver comb-teeth electrodes.

The present movable micro-device includes, as a pair of capacitor electrodes, the first and the second capacitor comb-teeth electrodes which are made of metal material. Therefore, the present movable micro-device is also suitable for achieving a higher Q-value, as is the movable micro-device according to the first aspect of the present invention.

In the first and the second aspects of the present invention, preferably, the electrode teeth of the first driver comb-teeth electrode extend from the movable main portion, on a side away from the electrode teeth of the first capacitor comb-teeth electrode. However, the electrode teeth of the first driver comb-teeth electrode may extend from the movable main portion on the same side as the electrode teeth of the first capacitor comb-teeth electrode.

Preferably, the connecting part includes an electroconductive portion having electrical connection with the first capacitor comb-teeth electrode of the movable part. Such an arrangement as the above allows appropriate connection of enables the first capacitor comb-teeth electrode with a predetermined external circuit.

Preferably, the first and/or the second capacitor comb-teeth electrode has a surface not provided with a dielectric film. If there is a dielectric film on a surface of the capacitor comb-teeth electrode, electric charge is trapped in a specific energy level on the surface of the dielectric film, and when the dielectric film comes in a high electric field (106 V/cm or higher, for example), the electric charge trapped on the surface is then injected into a defect level inside the dielectric film. In a dielectric film, the relaxation time constant of an injected electric charge can be substantially long, and this can increase the amount of charge accumulation in the dielectric film while the movable micro-device is in operation, resulting in a state where the amount of charge accumulation no longer decrease. Such a phenomenon of charge trapping and injection in the dielectric film is undesirable because this can disturb appropriate operation of the movable micro-device.

Preferably, the movable micro-device according to the first or the second aspect is made as a variable capacitor for variation of an electrostatic capacity between the first and the second capacitor comb-teeth electrodes. As another option, the movable micro-device according to the first or the second aspect may be made as a sensing device for detection of an electrostatic capacity between the first and the second capacitor comb-teeth electrodes.

Preferably, the present movable micro-device is packaged by using an electrically insulating low-viscosity liquid or an electrically insulating low-viscosity gas as a filler. Such an arrangement as this makes it possible to provide good packaging.

DETAILED DESCRIPTION OF THE PREFERRED EMBODIMENTS

Figure 1:
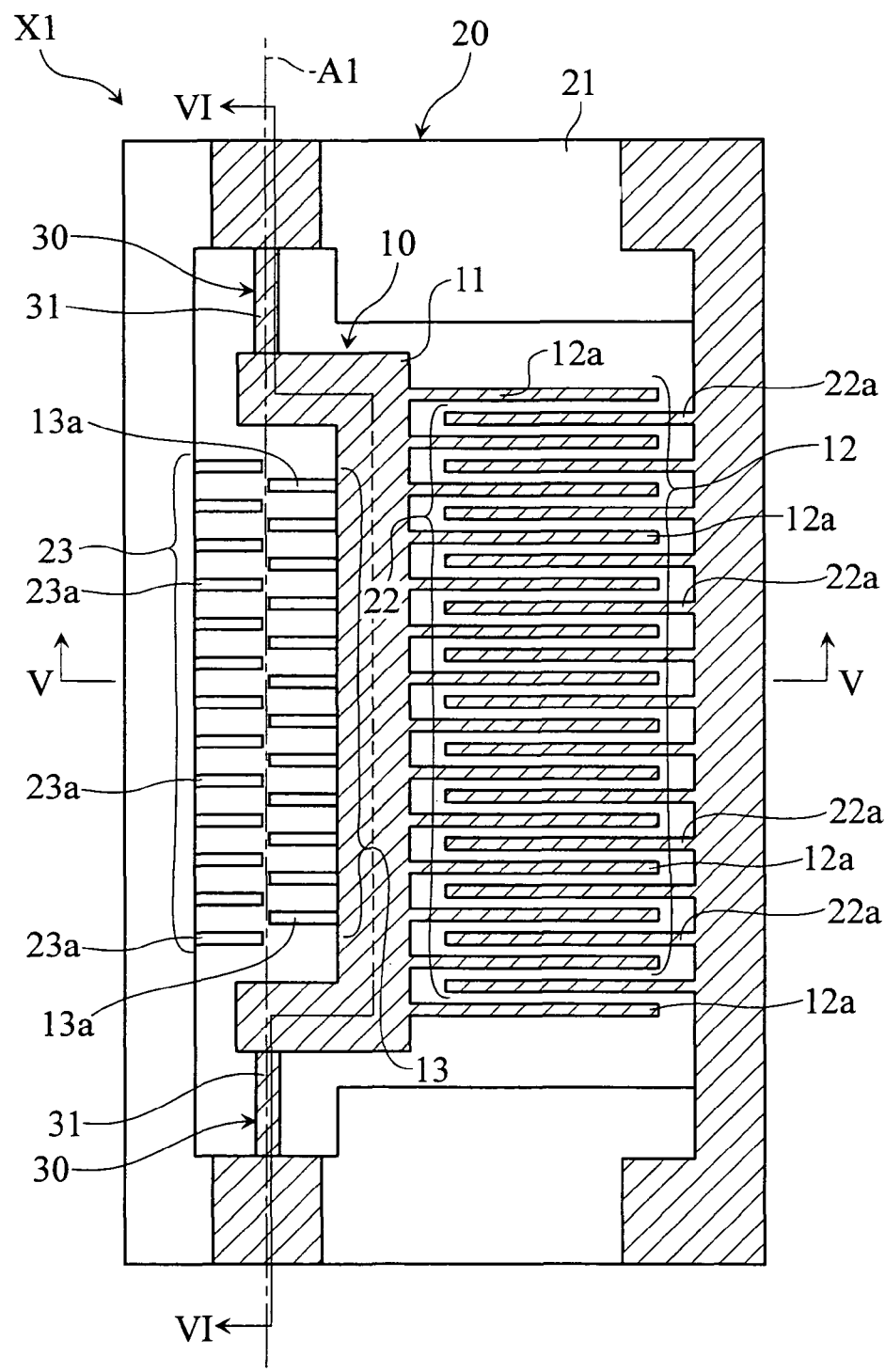
FIG. 1 is a plan view of a movable micro-device according to a first embodiment of the present invention.
Figure 2:
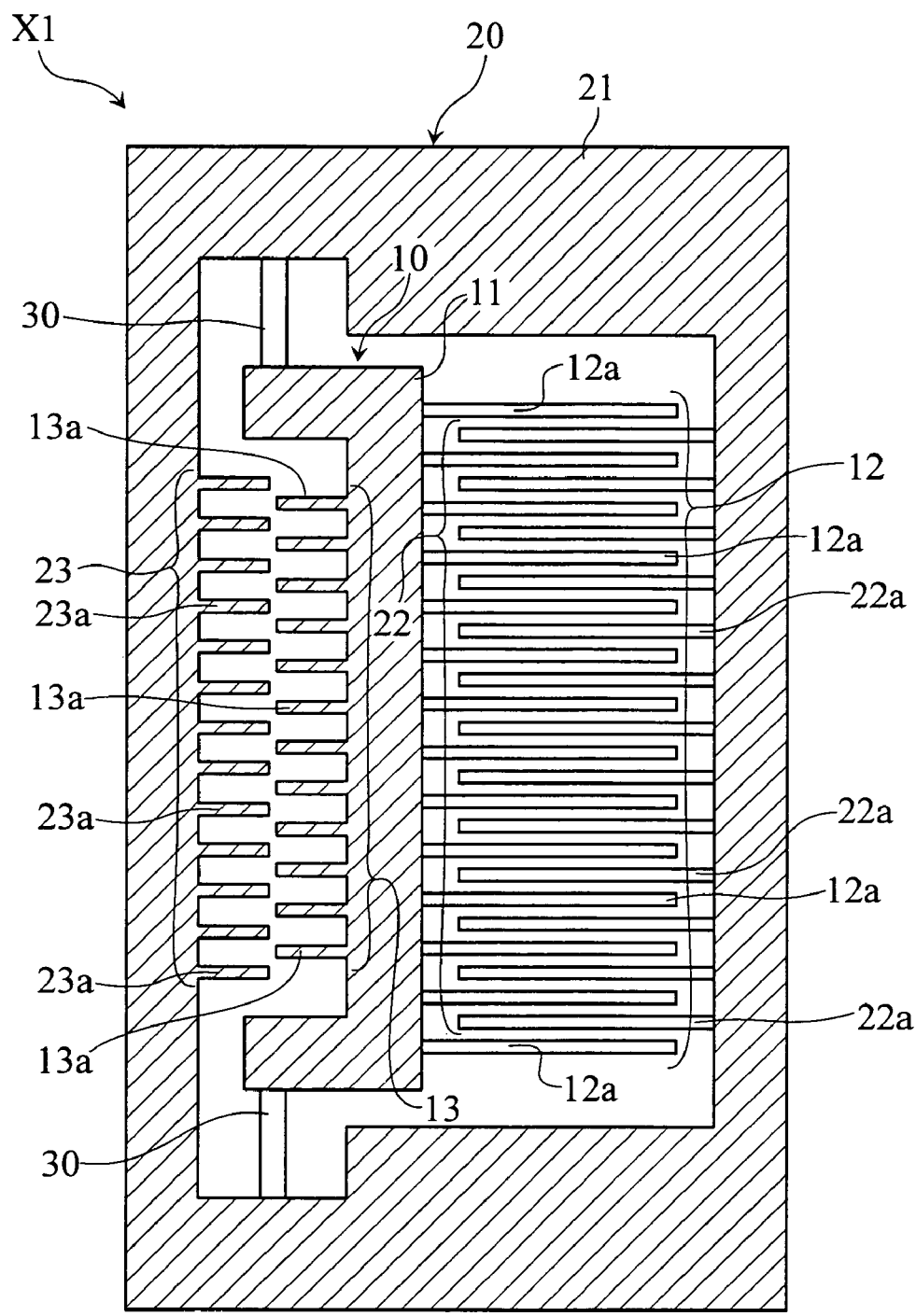
FIG. 2 is another plan view of a movable micro-device according to the first embodiment of the present invention.
Figure 3:
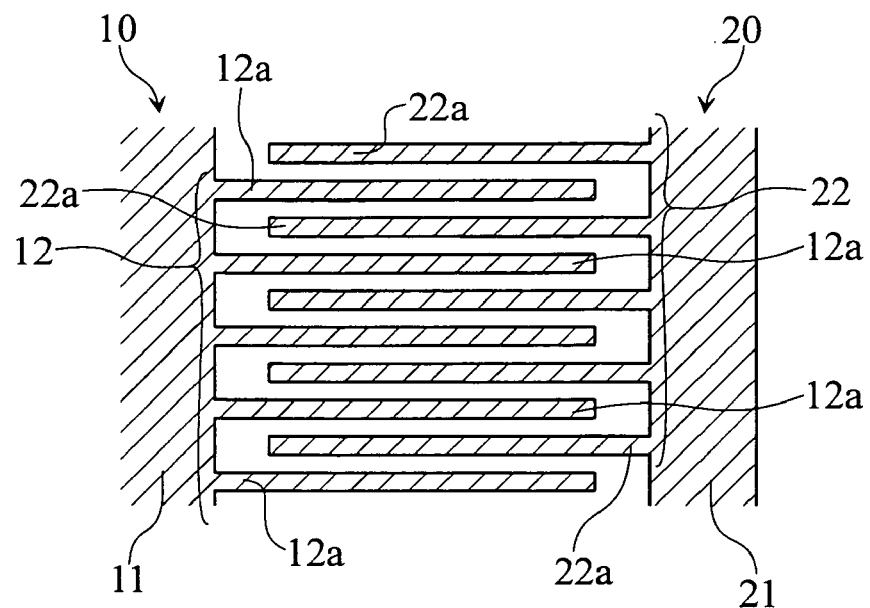
FIG. 3 is an enlarged partial view of FIG. 1.
Figure 4:
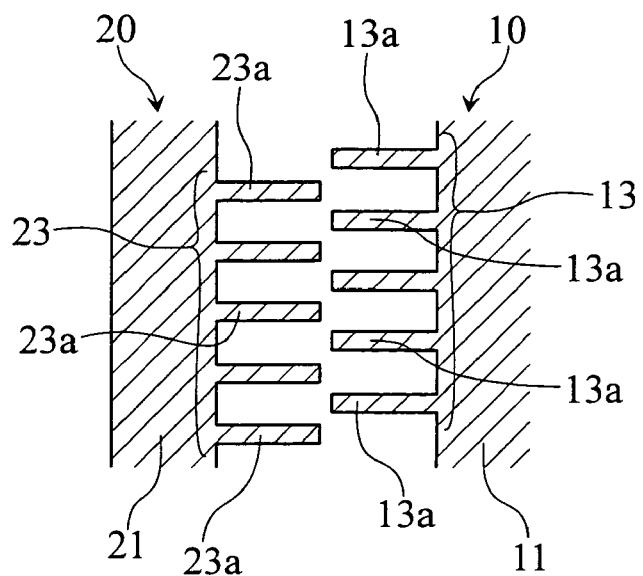
FIG. 4 is an enlarged partial view of FIG. 2.
Figure 5:
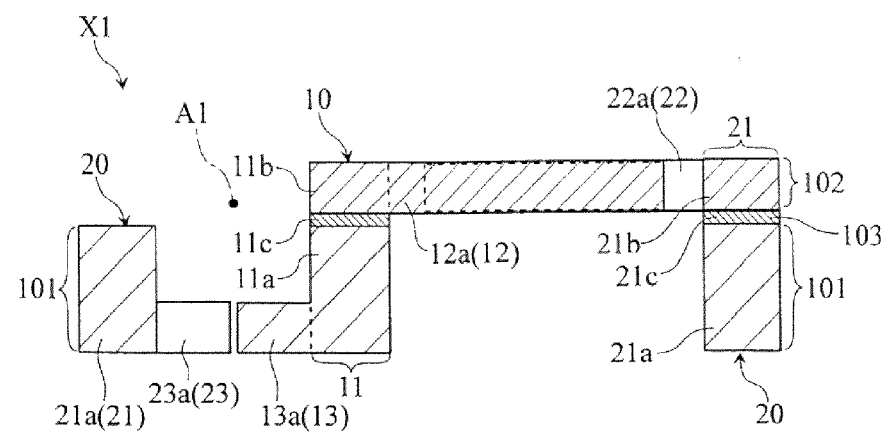
FIG. 5 is an enlarged sectional view taken along lines V-V in FIG. 1.
Figure 6:
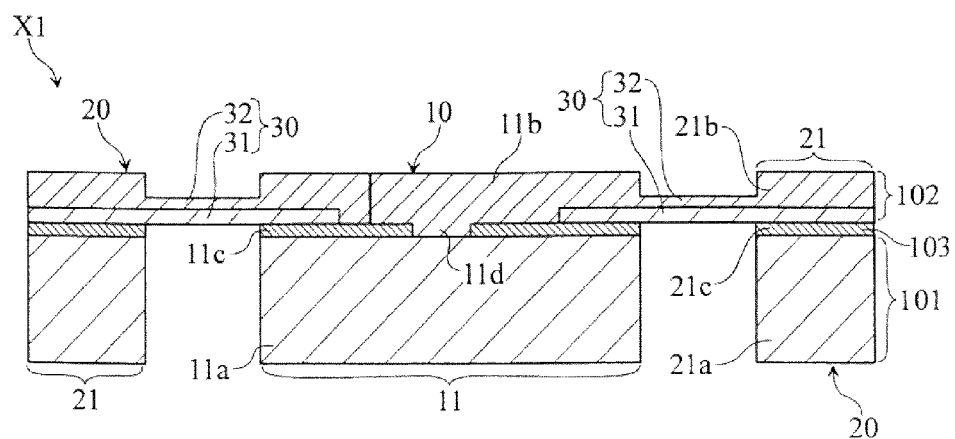
FIG. 6 is an enlarged, fragmental sectional view taken along lines VI-VI in FIG. 1.
Figure 7:
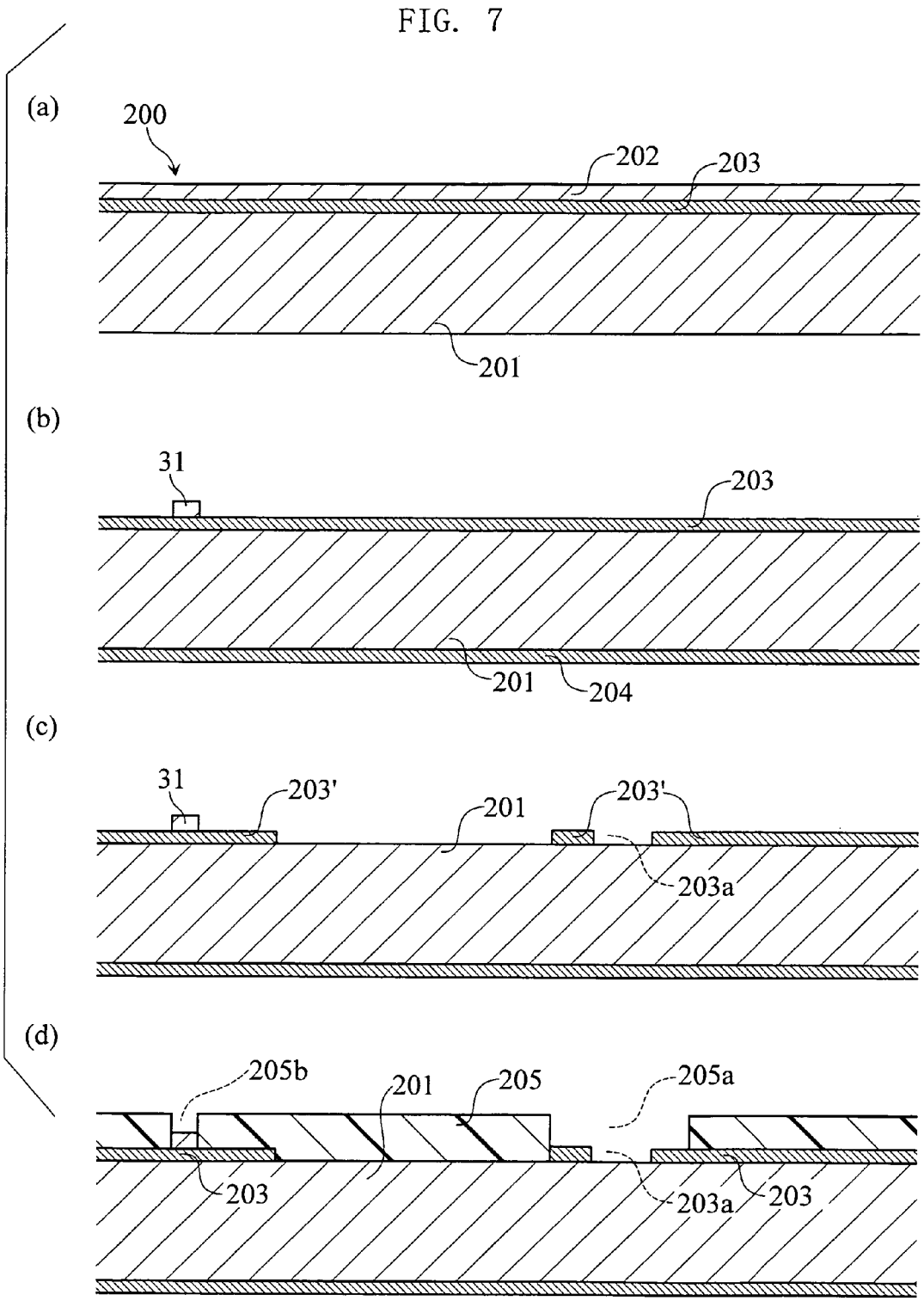
FIG. 7 shows steps in a method for making the movable micro-device in FIG. 1.
Figure 8:
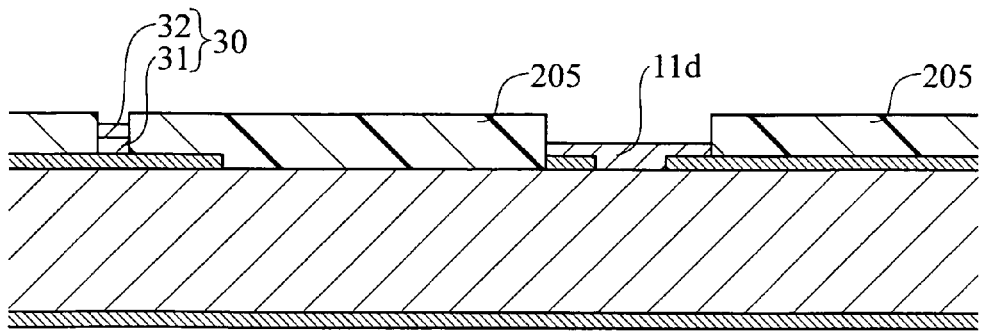
FIG. 8 shows steps following those of FIG. 7.
Figure 8:
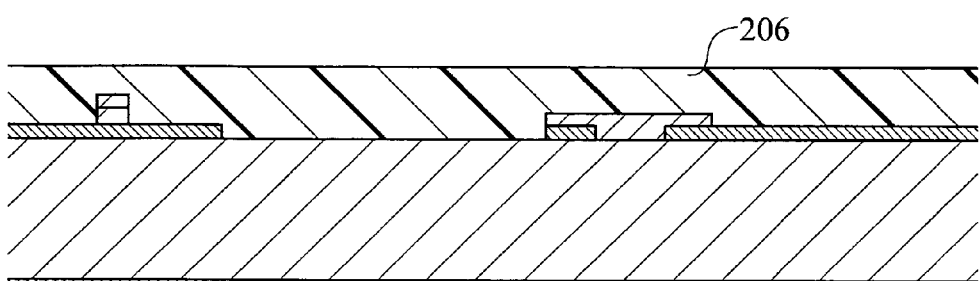
Figure 8:
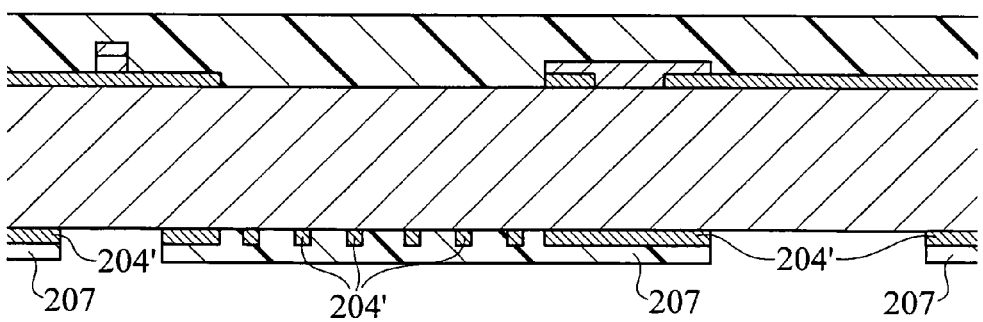
Figure 8:
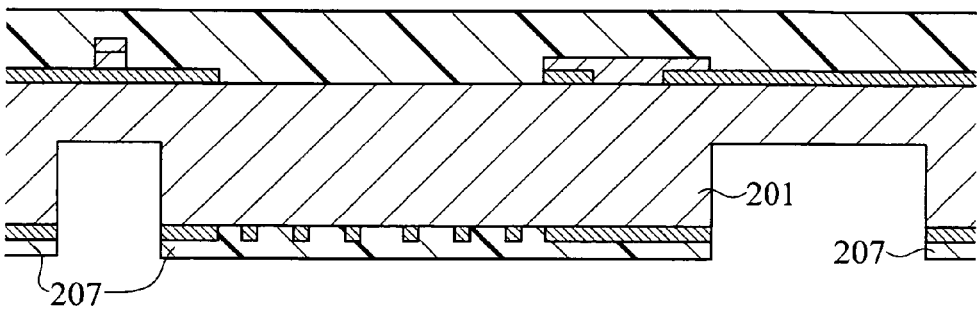
Figure 9:
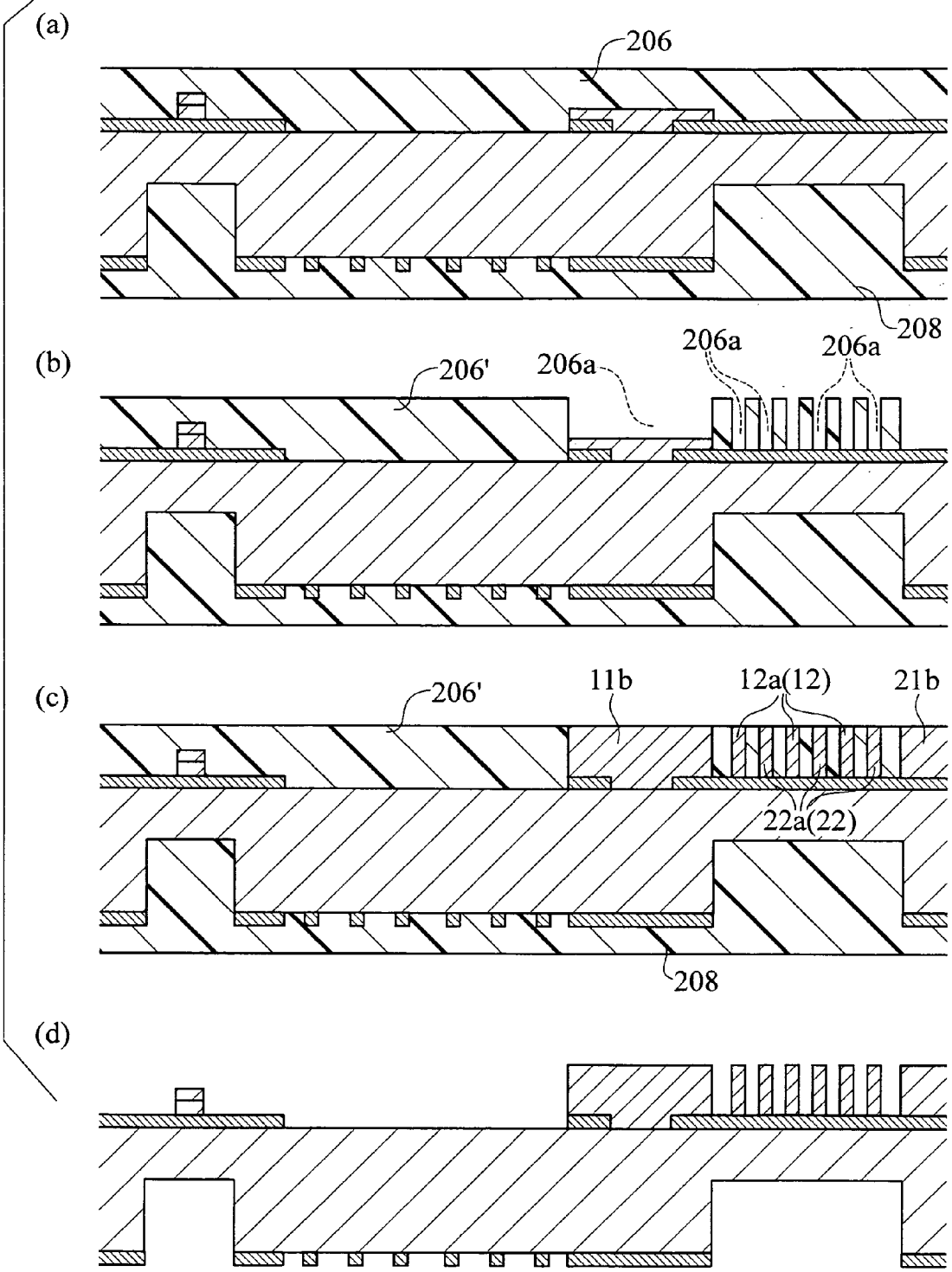
FIG. 9 shows steps following those of FIG. 8.
Figure 10:
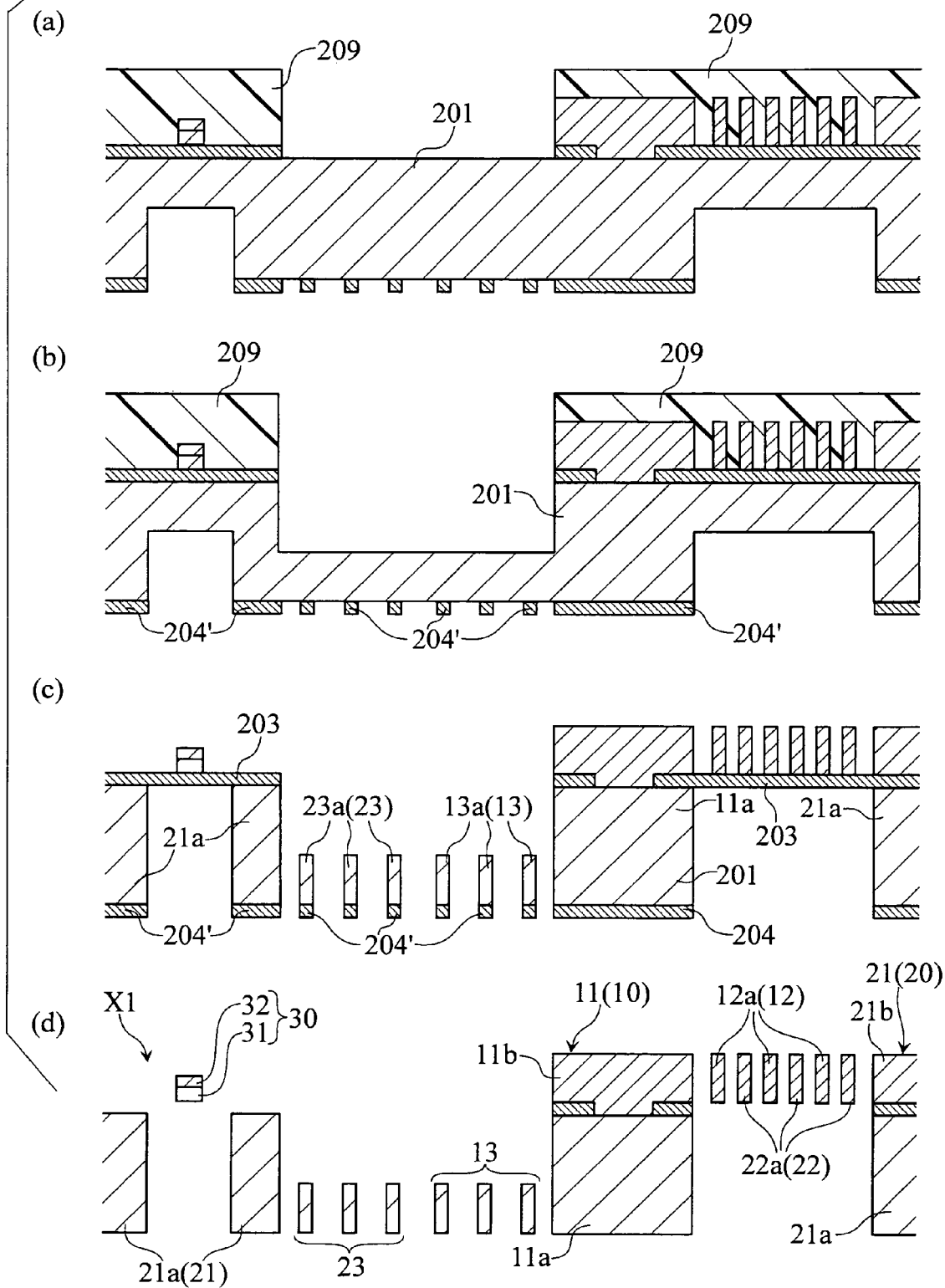
FIG. 10 shows steps following those of FIG. 9.

FIG. 1 through FIG. 6 show a movable micro-device X1 according to a first embodiment of the present invention. FIG. 1 and FIG. 2 are plan views of the movable micro-device X1. FIG. 3 is an enlarged partial view of FIG. 1 whereas FIG. 4 is an enlarged partial view of FIG. 2. FIG. 5 is a sectional view taken along lines V-V in FIG. 1. FIG. 6 is a fragmental, enlarged sectional view taken along lines VI-VI.

The movable micro-device X1 includes a movable part 10, a frame 20 and a pair of connecting parts 30. The movable micro-device X1 is manufactured by micromachining technology such as MEMS technology, from a predetermined material substrate, and has a laminate structure as a whole, including primarily a first layer 101 provided by a silicon material which is doped with impurity and has a predetermined level of electric conductivity, a second layer 102 made of a metal material such as Au, Ag, Cu and Al, and an insulation layer 103 between the first layer 101 and the second layer 102. For the sake of clarification, the second layer 102 is hatched in FIG. 1, and the first layer 101 is hatched in FIG. 2.

The movable part 10 includes a movable main portion 11 and comb-teeth electrodes 12, 13, and is displaceable with respect to the frame 20 in a swinging or rotating manner. As shown in FIG. 5 and FIG. 6, the movable main portion 11 has a laminate structure including a portion 11a which is part of the first layer 101, a portion 11b which is part of the second layer 102, and an insulation layer 11c which is part of the insulation layer 103. Also, as shown in FIG. 6, the movable main portion 11 is provided with an electroconductive via (or via hole) 11d penetrating the insulation layer 11c, for establishing electric connection between the portion 11a and the portion 11b. The comb-teeth electrodes 12 is part of the second layer 102, and is provided by a plurality of electrode teeth 12a extending in parallel to each other from the movable main portion 11. The length of extension of the electrode teeth 12a is 5 through 5000 μm for example. The comb-teeth electrode 13 is part of the first layer 101, and is provided by a plurality of electrode teeth 13a extending in parallel to each other from the movable main portion 11 away from the electrode teeth 12a. The length of extension of the electrode teeth 13a is 5 through 5000 μm for example.

The frame 20 includes a main frame portion 21 and comb-teeth electrodes 22, 23. As shown in FIG. 5 and FIG. 6, the main frame portion 21 has a laminate structure including a portion 21a which is part of the first layer 101, a portion 21b which is part of the second layer 102, and an insulation layer 21c which is part of the insulation layer 103. The main frame portion surrounds the movable part 10. The comb-teeth electrodes 22 is part of the second layer 102, and is provided by a plurality of electrode teeth 22a extending in parallel to each other from the main frame portion 21 toward the comb-teeth electrode 12 of the movable part 10. The length of extension of the electrode teeth 22a is 5 through 5000 μm for example. The comb-teeth electrode 23 is part of the first layer 101, and is provided by a plurality of electrode teeth 23a extending in parallel to each other from the main frame portion 21 toward the comb-teeth electrode 13. The length of extension of the electrode teeth 23a is 5 through 5000 μm for example.

The comb-teeth electrode 12 of the movable part 10 and the comb-teeth electrode 22 of the frame 20 constitute a pair of capacitor electrodes in the micro variable device X1, and as shown in FIG. 3 and FIG. 5, the electrode teeth 12a of the comb-teeth electrode 12 and electrode teeth 22a of the comb-teeth electrodes 22 have their side surfaces opposed to each other in their initial position. In other words, the comb-teeth electrodes 12, 22 have their electrode teeth overlapped with each other in their initial position.

The comb-teeth electrode 13 of the movable part 10 and the comb-teeth electrode 23 of the frame 20 constitute a pair of capacitor electrodes in the micro variable device X1. As shown in FIG. 4 and FIG. 5 for example, the comb-teeth electrodes 13, 23 do not have electrode teeth overlap with each other in their initial position, according to the present embodiment. The comb-teeth electrodes 13, 23 may have electrode teeth overlap with each other in their initial position. The comb-teeth electrodes 12, 13 in the movable part 10, the comb-teeth electrode 22 and the comb-teeth electrodes 23 are electrically separated from each other.

As shown in FIG. 6, each connecting part 30 includes a main portion 31 and an electroconductive portion 32, and connects the movable part 10 and the frame 20. The electroconductive portion 32 in each connecting part 30 contains a metal such as Au, Ag, Cu and Al, providing electrical connection between the portion 11b of the movable main portion 11 and the portion 21b of the main frame portion 21. In the present embodiment, the movable part 10 which includes the comb-teeth electrodes 12, 13 is grounded via the connecting part 30 or electroconductive portion 32. The connecting part 30 may be provided with a plurality of electroconductive portions 32 which are electrically separated from each other. The pair of connecting parts 30 defines an axis A1 for rotational displacement of the movable part 10 with respect to the frame 20.

FIG. 7 through FIG. 10 show a method for manufacturing the movable micro-device X1. FIG. 7 through FIG. 10 show a sectional view in series, following steps of forming the above-described movable main portion 11, the comb-teeth electrodes 12, 13, the frame main portion 21, the comb-teeth electrodes 22, 23, and the connecting parts 30. The section shown in the views is a conceptual composite representing various portions from different sections of the material substrate (wafer) to which micromachining is performed.

In the manufacture of the movable micro-device X1, first, a material substrate 200 as shown in FIG. 7(a) is prepared. The material substrate 200 is a so called SOI (silicon on insulator) substrate, and has a laminate structure including silicon layers 201, 202, and an insulation layer 203 between the silicon layers. The silicon layer 201 is doped with impurity and thus has a predetermined level of electric conductivity. The insulation layer 203 is made of silicon oxide for example. The silicon layer 201 has a thickness of 50 through 600 μm for example. The silicon layer 202 has a thickness of 1 through 100 μm for example. The insulation layer 203 has a thickness of 0.5 through 50 μm for example.

Next, as shown in FIG. 7(b), an oxide film 204 is formed on a surface of the silicon layer 201. The main portion 31 of the connecting part 30 is also formed. The oxide film 204 can be formed by CVD method, i.e. by forming a film of silicon oxide on the surface of the silicon layer 201 to a thickness of 1 μm. Formation of the main portion 31 can be achieved, for example, by first forming a predetermined resist pattern (not illustrated) on the silicon layer 202, and then performing DRIE (Deep Reactive Ion Etching) to the silicon layer 202 using the resist pattern as a mask. In the DRIE operation, good anisotropic etching can be performed by using a Bosch process in which etching and side-wall protection are alternated with each other. The DRIE operation in this step and other steps to be described later may be performed by the Bosch process.

Next, as shown in FIG. 7(c), an insulation film pattern 203' is formed. Specifically, a resist pattern (not illustrated) is formed on the insulation layer 203 and then etching is performed to the insulation layer 203, using the resist pattern as a mask. The insulation film pattern 203' has predetermined openings including an opening 203a for formation of the electroconductive via 11d.

Next, an underlying film (not illustrated) for electroplating is formed on the silicon layer 201 to cover the insulation film pattern 203' and the main portion 31, and thereafter, a resist pattern 205 is formed as shown in FIG. 7(d) The underlying film can be formed by spattering method for example, i.e. by first forming a film of Ti to a thickness of 50 nm, and then forming thereon a film of Cu to a thickness of 500 nm. The resist pattern 205 has an opening 205a and an opening 205b.

Next, as shown in FIG. 8(a), electroplating is performed to grow metal in the openings 203a, 205a, 205b. This step yields the electroconductive via 11d and the electroconductive portion 32. The metal material used in this step is selected from a group consisting of Au, Ag, Cu and Al, or an alloy containing the metal.

Next, a resist film 206 is formed as shown in FIG. 8(b), by further forming a film of the resist material on the resist pattern 205 or by first removing the resist pattern 205 and then newly forming a film of resist material.

Next, as shown in FIG. 8(c), the oxide film 204 is patterned to form an oxide film pattern 204', and thereafter a resist pattern 207 is formed which has predetermined openings. The oxide film pattern 204' is a pattern to form the movable main portion 11, the comb-teeth electrode 13, the main frame portion 21, and the comb-teeth electrode 23.

Next, as shown in FIG. 8(d), DRIE is performed to the silicon layer 201, using the resist pattern 207 as a mask, until a midway point of the thickness is reached in the silicon layer 201.

Next, as shown in FIG. 9(a), a resist film 208 is formed by further forming a film of the resist material on the resist pattern 207 or by first removing the resist pattern 207 and then newly forming a film of resist material.

Next, as shown in FIG. 9(b), the resist film 206 is patterned to form a resist pattern 206'. The resist pattern 206' has openings 206a for formation of the second layer 102 (the portion 11b of the movable main portion 11, the comb-teeth electrodes 12, the portion 21b of the main frame portion 21 and the comb-teeth electrodes 22) in the movable micro-device X1.

Next, as shown in FIG. 9(c), electroplating is performed to grow metal material in the openings 206a, and thereby to form the portion 11b of the movable main portion 11, the comb-teeth electrode 12 or electrode teeth 12a, the portion 21b of the main frame portion 21, and the comb-teeth electrodes 22 or electrode teeth 22a. The metal material used in this step is selected from a group consisting of Au, Ag, Cu and Al, or an alloy containing the metal.

Next, as shown in FIG. 9(d), the resist pattern 206' and the resist film 208 are removed. The removal of the resist pattern 206' and the resist film 208 can be made by a predetermined remover. Thereafter, exposed portions of the underlying film (not illustrated) which was formed for the electroplating are removed. The partial removal of the underlying film can be achieved by wet etching with a predetermined etchant or by ion milling.

Next, as shown in FIG. 10(a), a resist pattern 209 is formed which has a predetermined opening. Next, as shown in FIG. 10(b), DRIE is performed to the silicon layer 201 from the side formed with the resist pattern 209, using the resist pattern 209 as a mask, until a midway point of the thickness is reached in the silicon layer 201.

Then, as shown in FIG. 10(c), DRIE is performed to the silicon layer 201 from the side formed with the oxide film pattern 204', using the oxide film pattern 204' as a mask. This step yields the first layer 101 (the portion 11a of the movable main portion 11, the comb-teeth electrodes 13 or electrode teeth 13a, the portion 21a of the main frame portion 21, and the comb-teeth electrodes 23 or electrode teeth 23a) in the movable micro-device X1.

Next, as shown in FIG. 10(d), exposed portions of the insulation layer 203 and the oxide film pattern 204' are etched off. Through the above-described series of steps, it is possible to manufacture the movable micro-device X1.

Figure 11:
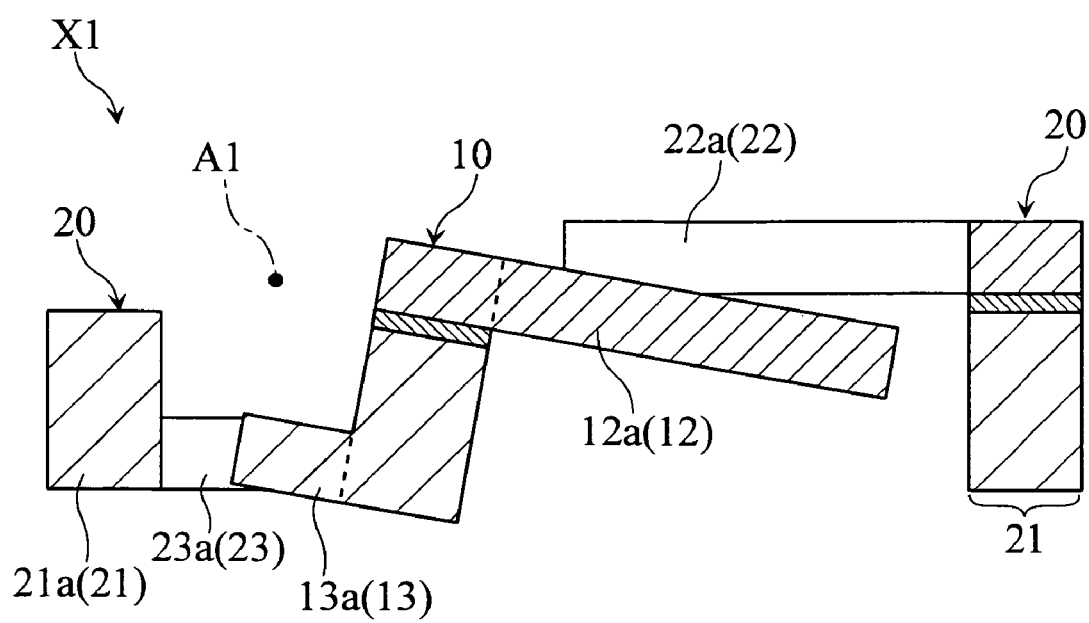
FIG. 11 shows a state where a movable part is rotationally displaced.

In the movable micro-device X1, it is possible to rock or rotationally displace the movable part 10 about the axis A1 as necessary, by applying a predetermined electric potential to the comb-teeth electrode 23. As the predetermined electric potential is applied to the comb-teeth electrode 23, a predetermined electrostatic attraction is generated between the comb-teeth electrodes 13, 23 (Note that the comb-teeth electrode 13 is grounded in the present embodiment), and therefore the comb-teeth electrode 13 is drawn toward the comb-teeth electrode 23. As a result, the movable part 10 rocks about the axis A4 as shown in FIG. 11 for example, and makes a rotational displacement to an angle at which the electrostatic attraction is counterbalanced by a sum of torsional stresses in the connecting parts 30. The amount of rotational displacement caused by such a rocking operation is adjustable through adjustment of the electric potential applied to the comb-teeth electrode 23. Through the adjustment on the amount of rotational displacement, it is possible to adjust the amount of opposed area between the comb-teeth electrodes 12, 22 (the area of side surfaces via which the electrode teeth 12a and the electrode teeth 22a oppose to each other), and therefore it is possible to adjust the electrostatic capacity between the comb-teeth electrodes 12, 22 which serve as a pair of capacitor electrodes. On the other hand, if the electrostatic attraction between the comb-teeth electrodes 13, 23 is removed, each connecting part 60 releases the torsional stresses held therein, to return to its natural state, allowing the movable part 10 or comb-teeth electrodes 12 to return to its initial position.

According to the movable micro-device X1, a pair of capacitor electrodes are provided by comb-teeth electrodes 12, 22 which is made of a metal material. Metal material generally has a lower resistivity than silicon material. Therefore, the movable micro-device X1 is more suitable for achieving a higher Q-value than the conventional variable micro-capacitor X4 in which the capacitor electrodes are made of an electroconductive silicon material.

In addition, the movable micro-device X1 is suitable for generating a large driving force between the driver electrode pair provided by the comb-teeth electrodes 13, 23. The comb-teeth electrodes 13, 23 which serve as a pair of driver electrodes in the movable micro-device X1 is formed, as has been described earlier, from the same material layer (silicon layer 201) by DRIE, using the oxide film pattern 204' formed on the silicon layer 201 as a mask. The resist pattern 204' includes the first mask pattern which is for the comb-teeth electrode 13 and the second mask pattern which is for the comb-teeth electrode 23. Mask patterns, such as the first and the second mask patterns formed on the same surface of a material layer can be formed at relatively high alignment accuracy. The first and the second mask patterns whose patterns are included in the same single mask pattern (resist pattern 204') formed on the same surface of a material layer, and therefore whose formation can be achieved by the same lithographic operation have no alignment error theoretically. Use of the first and the second mask patterns as described above enables to form comb-teeth electrodes 13, 23 which have a high relative positional accuracy, making it easy to design a narrow gap between the electrode teeth 13a, 23a for the electrode teeth overlap between the comb-teeth electrodes 13, 23 which serve as a pair of driver electrodes. Therefore, the movable micro-device X1 is suitable for generating a large driving force between the driver electrode pair provided by the comb-teeth electrodes 13, 23. The movable micro-device X1 as described above is suitable for decreasing a driving voltage to be applied to the pair of driver electrodes (comb-teeth electrodes 13, 23).

According to the movable micro-device X1, the comb-teeth electrodes 12, 22 serving as a pair of capacitor electrodes have their surfaces free of dielectric film. This enables to avoid electric charge trapping and injection which can occur in a dielectric film.

In the movable micro-device X1, the first layer 101 (the portion 11a of the movable main portion 11, the comb-teeth electrode 13, the portion 21a of the main frame portion 21 and the comb-teeth electrodes 23) may not necessarily be made from an electroconductive silicon material, but may be formed of a metal material. The metal material should preferably be a metal selected from a group consisting of Au, Ag, Cu and Al or an alloy containing the metal. As another variation in the movable micro-device X1, the entire movable part 10 may be formed as a continuous metal structure. With whichever of the arrangements employed, the movable micro-device X1 is suitable for achieving a high Q-value.

The movable micro-device X1 as described so far may be designed as a variable capacitor for varying the electrostatic capacity between the comb-teeth electrodes 12, 22, or as a sensing device for detecting the electrostatic capacity between the comb-teeth electrodes 12, 22.

Figure 12:
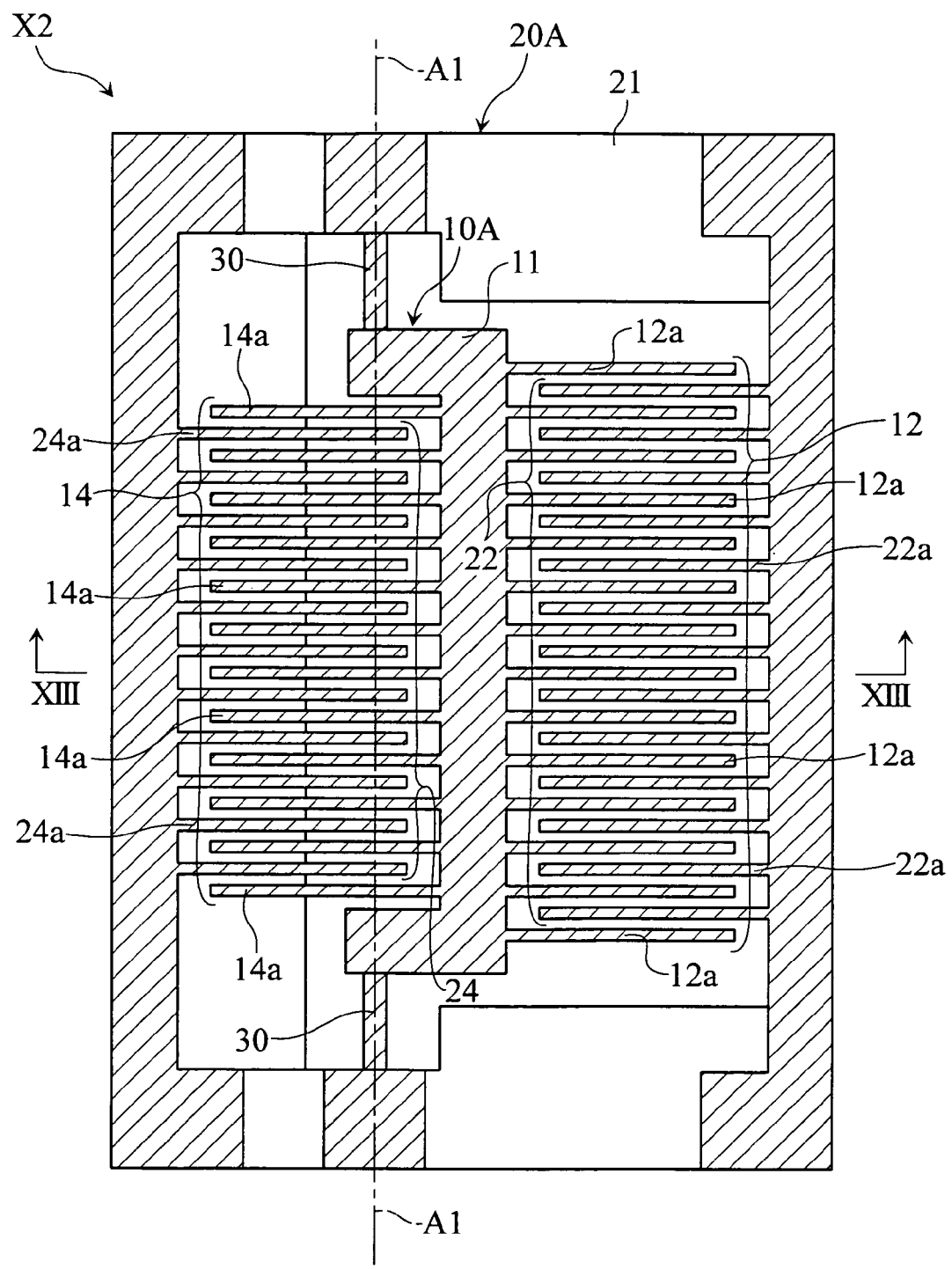
FIG. 12 is a plan view of a movable micro-device according to a second embodiment of the present invention.
Figure 13:
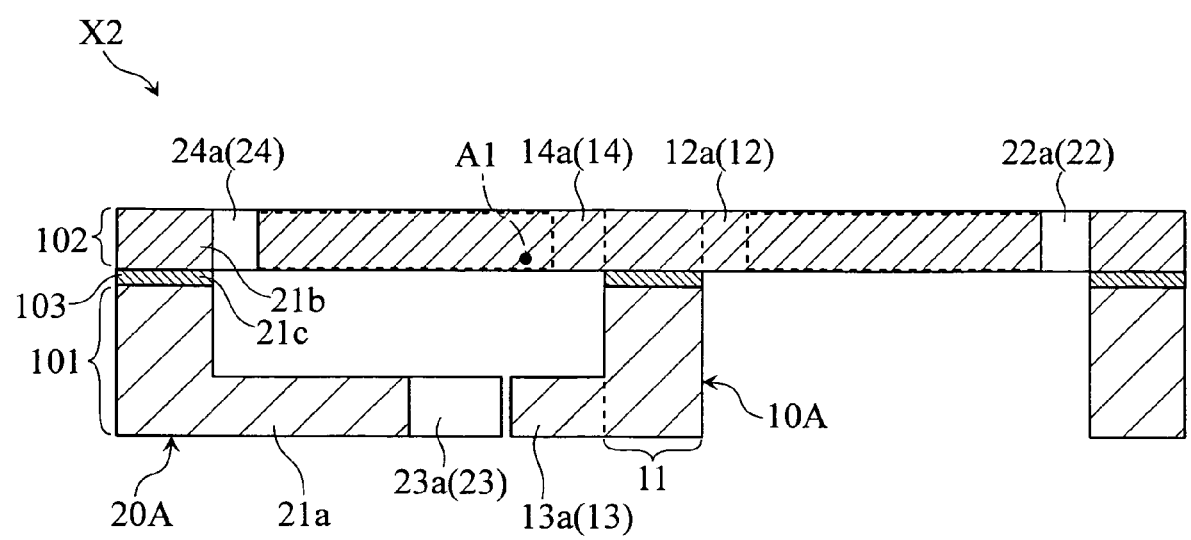
FIG. 13 is a sectional view taken along lines XIII-XIII in FIG. 12.

FIG. 12 and FIG. 13 show a movable micro-device X2 according to a second embodiment of the present invention. FIG. 12 is a plan view of the movable micro-device X2. FIG. 13 is a sectional view taken along lines XIII-XIII in FIG. 12.

The movable micro-device X2 includes a movable part 10A, a frame 20A and a pair of connecting parts 30, differing from the movable micro-device X1 in that the movable part 10 and the frame 20 are replaced by the movable part 10A and the frame 20A respectively.

The movable part 10A differs from the movable part 10 of the movable micro-device X1 in that it has a movable main portion 11 and comb-teeth electrodes 12, 13, 14, i.e. that it has a comb-teeth electrode 14 additionally. As shown in FIG. 13, the comb-teeth electrode 14 is part of the second layer 102, and is provided by a plurality of electrode teeth 14a which extend in parallel to each other from the movable main portion 11 on the same side with the electrode teeth 13a. The length of extension of the electrode teeth 14a is 5 through 5000 μm for example. The movable main portion 11 and the comb-teeth electrodes 12, 13 in the movable part 10A are identical with the movable main portion 11 and the comb-teeth electrodes 12, 13 in the movable part 10.

The frame 20A has a main frame portion 21 and comb-teeth electrodes 22, 23, differing from the frame 20 of the movable micro-device X1 in that it has a comb-teeth electrode 24 additionally. As shown in FIG. 13, the comb-teeth electrode 24 is part of the second layer 102, and is provided by a plurality of electrode teeth 24a which extend in parallel to each other from the main frame portion 21 toward the comb-teeth electrode 14. The length of extension of the electrode teeth 24a is 5 through 5000 μm for example. The main frame portion 21 and comb-teeth electrodes 22, 23 in the frame 20A are identical with the main frame portion 21 and comb-teeth electrodes 22, 23 in the frame 20.

The comb-teeth electrodes 12 of the movable part 10A and the comb-teeth electrode 22 of the frame 20A constitute a pair of capacitor electrodes in the movable micro-device X2. Further, the comb-teeth electrode 14 of the movable part 10A and the comb-teeth electrode 24 of the frame 20A constitute another pair of capacitor electrodes. In their initial position, electrode teeth 12a of the comb-teeth electrode 12 and electrode teeth 22a of the comb-teeth electrodes 22 have their side surfaces opposed to each other, whereas the electrode teeth 14a of the comb-teeth electrode 14 and electrode teeth 24a of the comb-teeth electrodes 24 have their side surfaces opposed to each other. In other words, the comb-teeth electrodes 12, 22 have electrode teeth overlap in the initial position and the comb-teeth electrodes 14, 24 also have electrode teeth overlap in the initial position. As described, the movable micro-device X2 includes two pairs of capacitor electrodes. The comb-teeth electrodes 12, 13, 14 in the movable part 10A, the comb-teeth electrode 22, the comb-teeth electrode 23 and the comb-teeth electrode 24 are electrically separated from each other.

All the other aspects of the movable micro-device X2 are the same as described earlier for the movable micro-device X1.

The movable micro-device X2 is suitable for achieving a high Q-value as is the movable micro-device X1, as well as suitable for generating a large driving force between the comb-teeth electrodes 13, 23 which serve as a pair of driver electrodes. In addition, the movable micro-device X2 which has two pairs of capacitor electrodes is suitable for achieving a large electrostatic capacity as a capacitor device.

Figure 14:
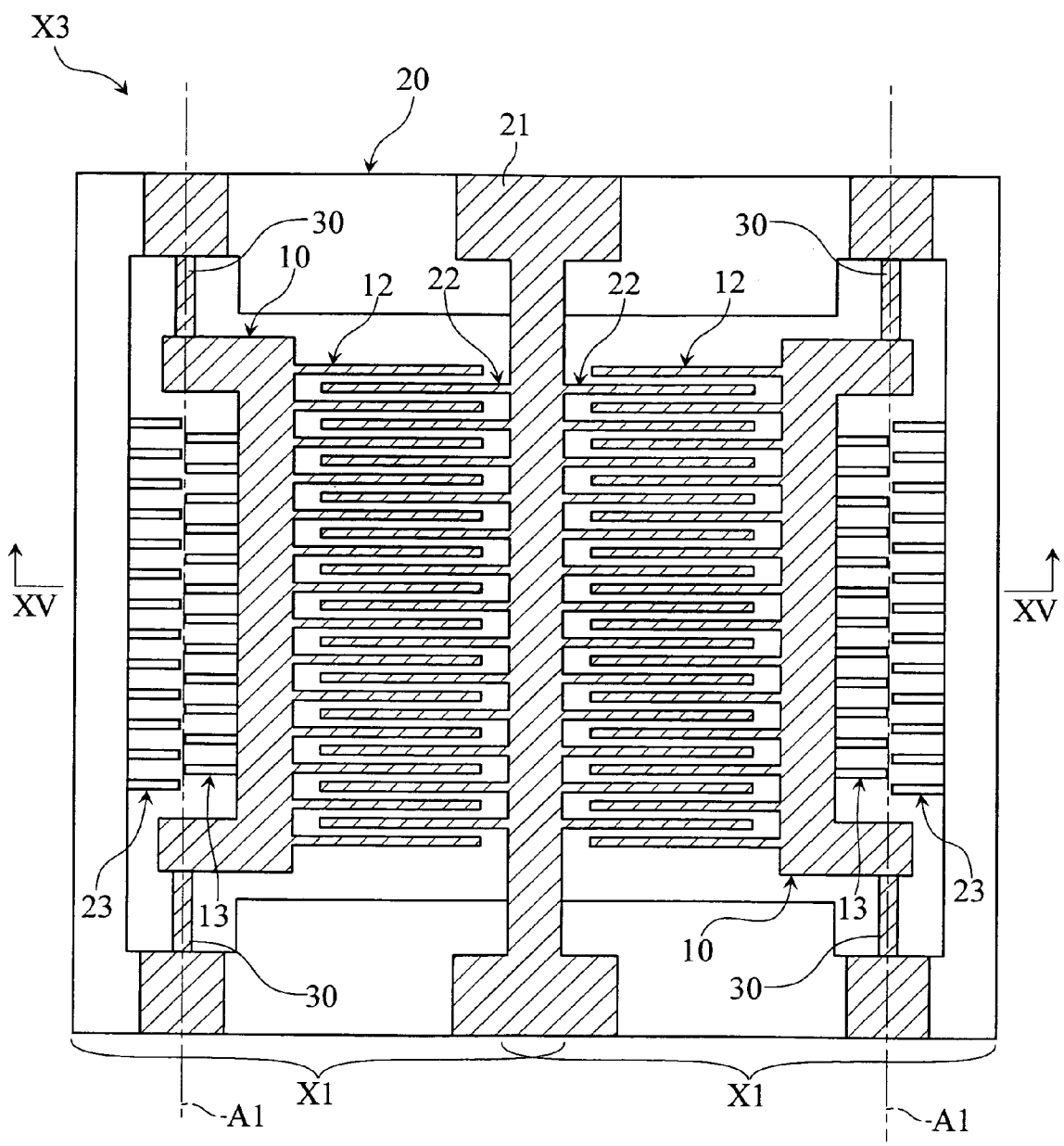
FIG. 14 is a plan view of a movable micro-device according to a third embodiment of the present invention.
Figure 15:
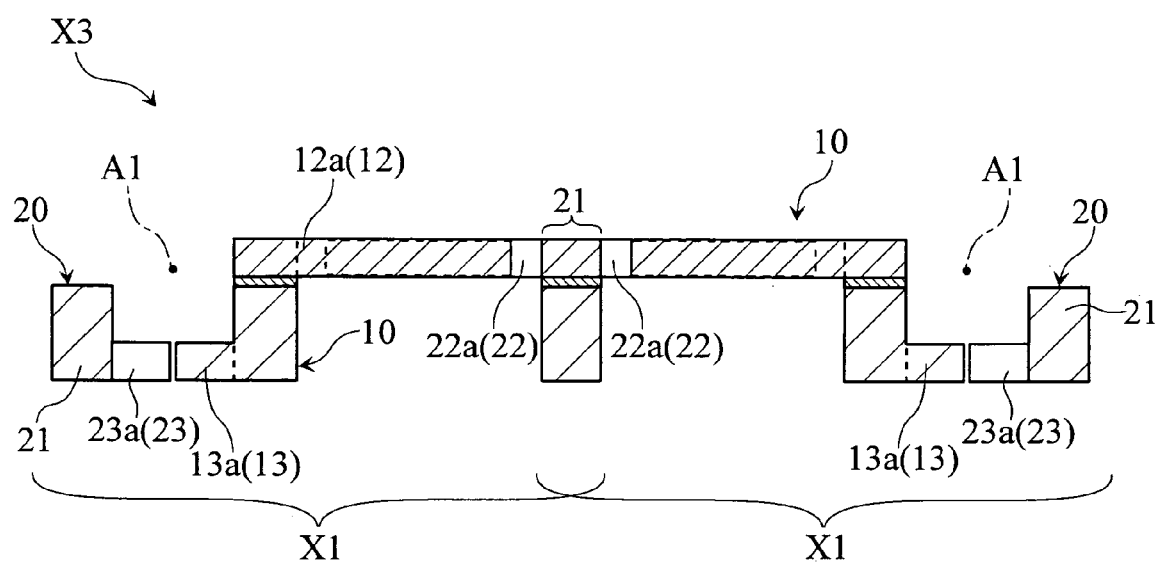
FIG. 15 is a sectional view taken along lines XV-XV in FIG. 14.
Figure 16:
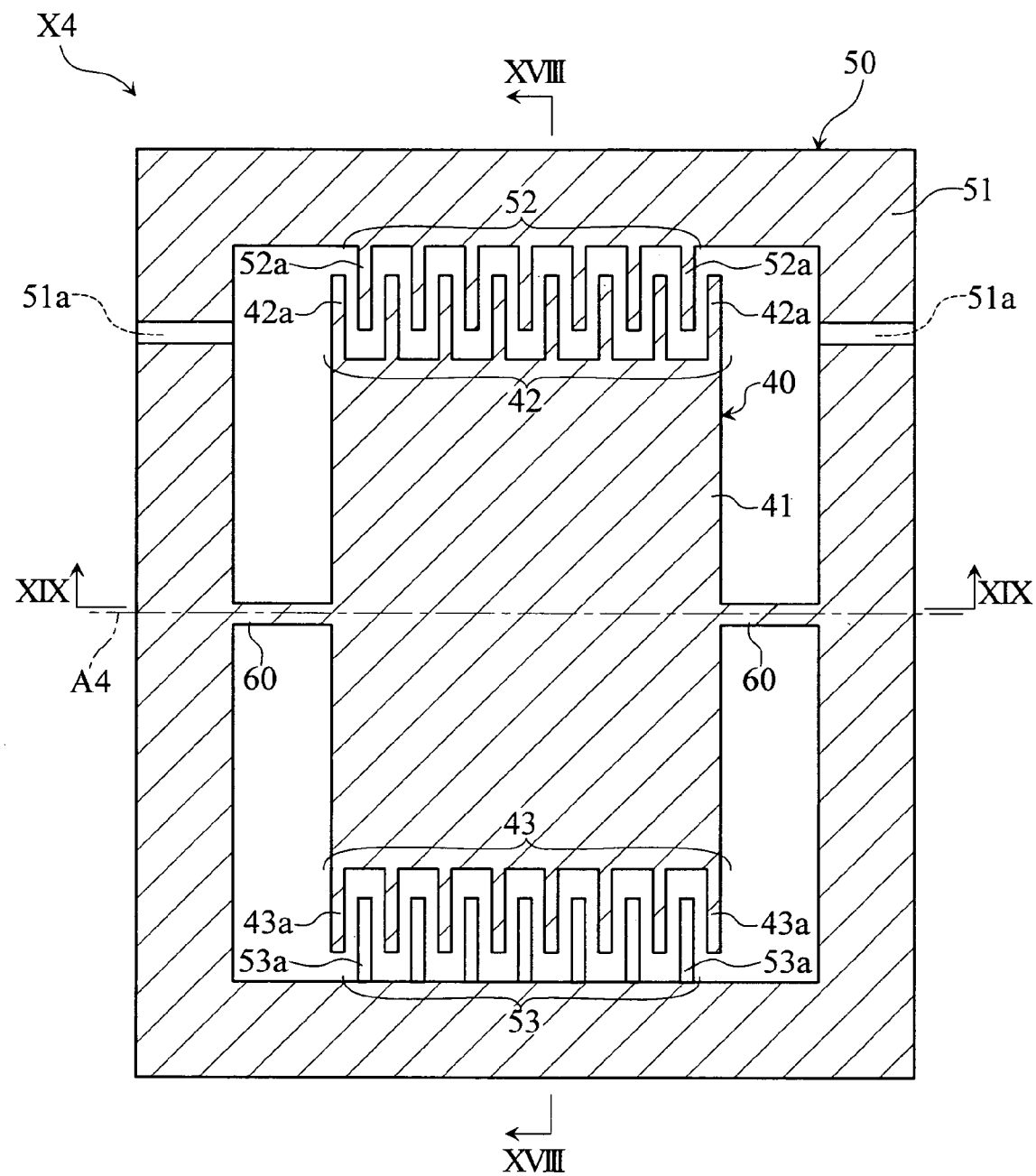
FIG. 16 is a plan view of a conventional movable micro-device.
Figure 17:
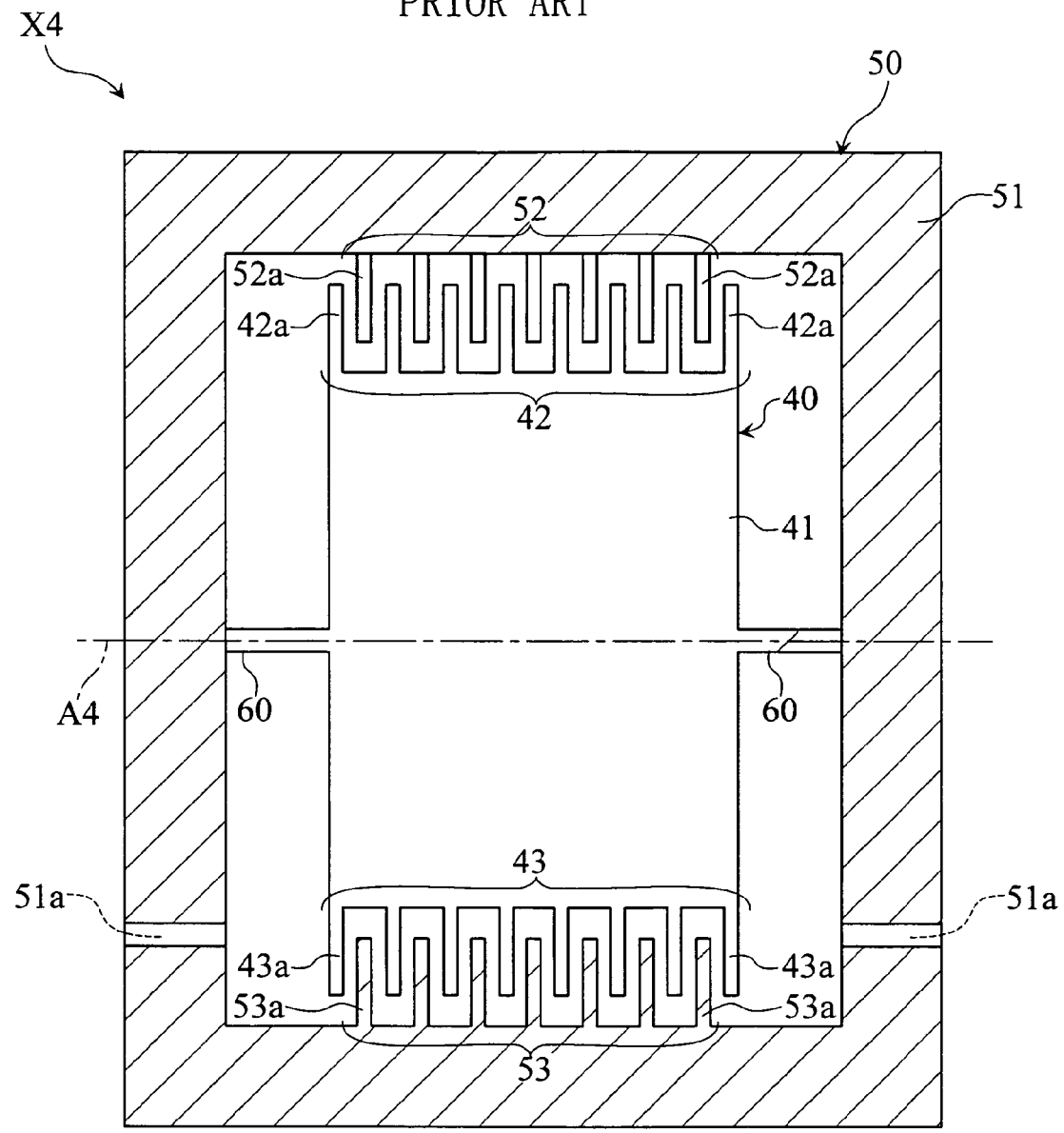
FIG. 17 is another plan view of the movable micro-device in FIG. 16.
Figure 18:
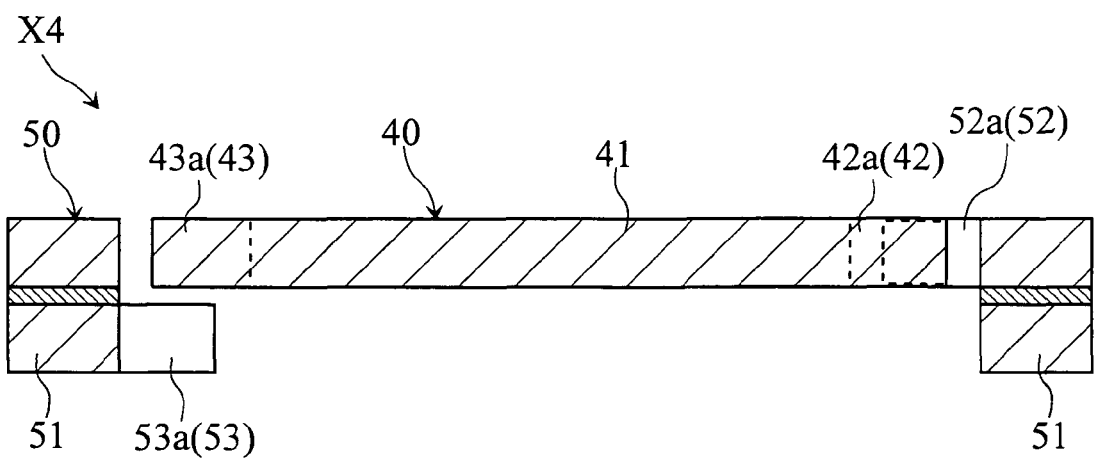
FIG. 18 is a sectional view taken along lines XVIII-XVIII in FIG. 16.
Figure 19:
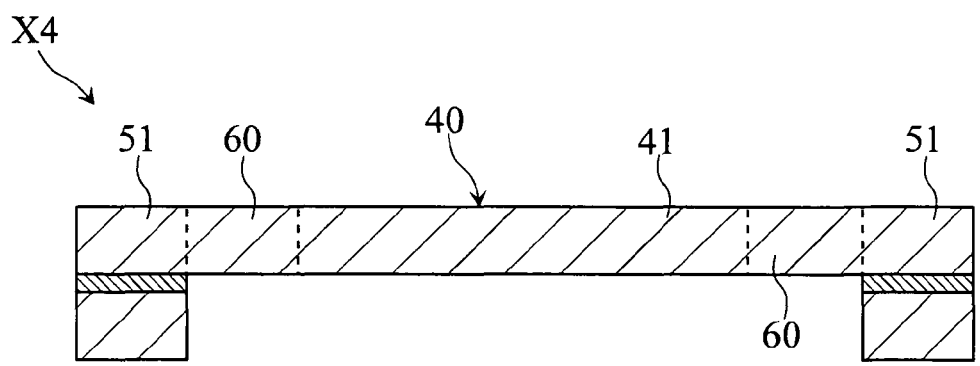
FIG. 19 is a sectional view taken along lines XIX-XIX in FIG. 16.
Figure 20:
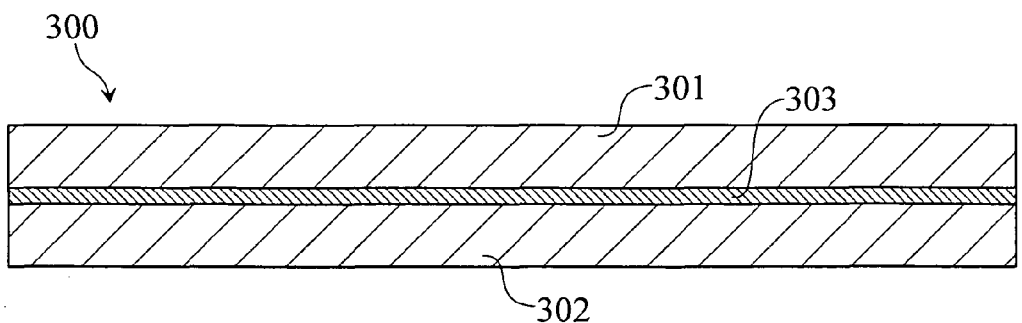
FIG. 20 shows steps in a method for making the conventional movable micro-device in FIG. 16.
Figure 20:
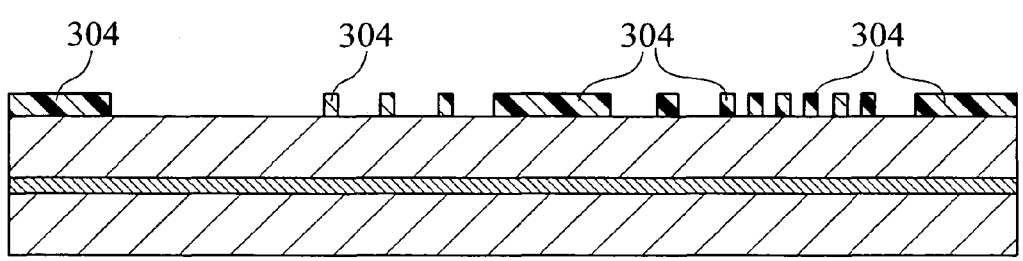
Figure 20:
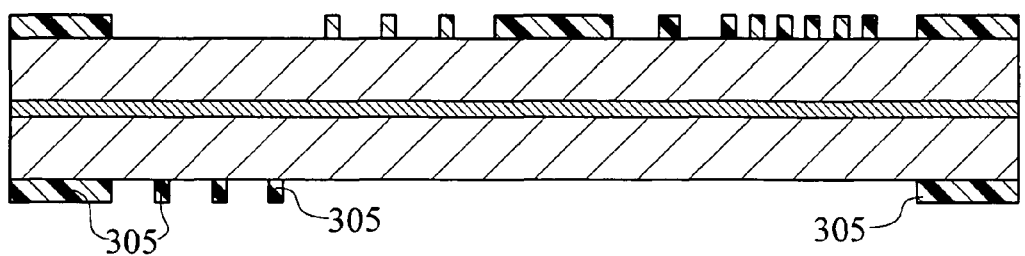
Figure 21:
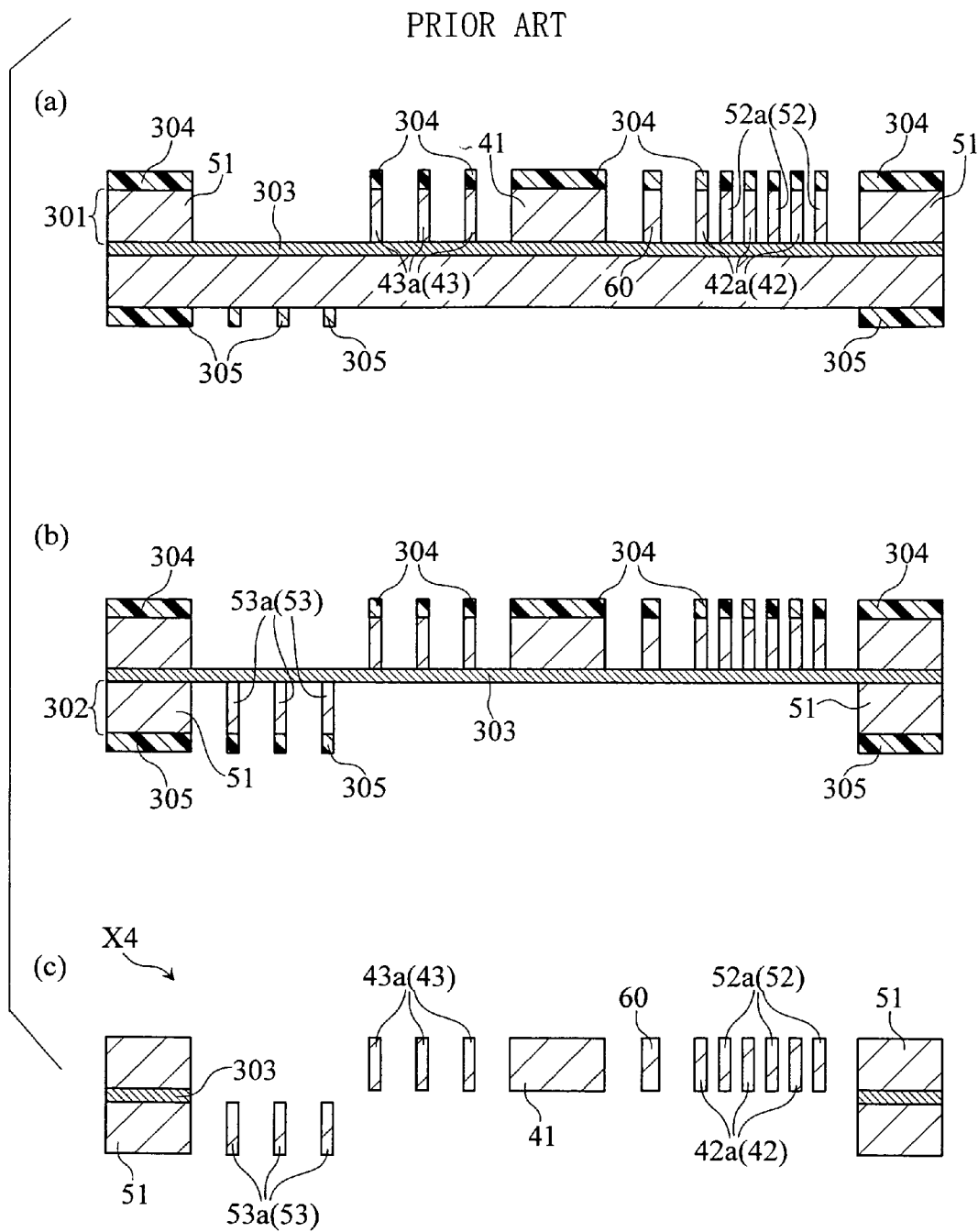
FIG. 21 shows steps following those of FIG. 20.

FIG. 14 and FIG. 15 show a movable micro-device X3 according to a third embodiment of the present invention. FIG. 14 is a plan view of the movable micro-device X3. FIG. 15 is a sectional view taken along lines XV-XV in FIG. 14.

The movable micro-device X3 includes virtually two movable micro-devices X1. Specifically, the movable micro-device X3 includes: a main frame portion 21 which is partially shared by two movable micro-devices X1; two pairs of capacitor electrodes (each capacitor electrode pair being provided by comb-teeth electrodes 12, 22); and two pairs of driver electrodes (each driver electrode pair being provided by comb-teeth electrodes 13, 23). The movable micro-device X3 may be controlled in such a way that each movable part 10 will make the same rotational displacement, or that each movable part 10 will make a rotational displacement individually.

The movable micro-device X3 as described is suitable for achieving a high Q-value as is the movable micro-device X1, as well as suitable for generating a large driving force between the comb-teeth electrodes 13, 23. In addition, the movable micro-device X3 which has two pairs of capacitor electrodes is suitable for achieving a large electrostatic capacity as a capacitor device.

The invention claimed is:

1. A movable micro-device comprising:
a movable part including a movable main portion, a first capacitor comb-teeth electrode and a first driver comb-teeth electrode, the first capacitor comb-teeth electrode having a plurality of electrode teeth extending from the movable main portion, the first driver comb-teeth electrode having a plurality of electrode teeth extending from the movable main portion;
a frame including a second capacitor comb-teeth electrode and a second driver comb-teeth electrode, the second capacitor comb-teeth electrode having a plurality of electrode teeth extending toward the first capacitor comb-teeth electrode, the second driver comb-teeth electrode having a plurality of electrode teeth extending toward the first driver comb-teeth electrode; and
a connecting part connecting the movable part and the frame to each other;
wherein the first and the second capacitor comb-teeth electrodes are made of a metal material and have electrode teeth overlap in an initial position,
wherein the first and the second driver comb-teeth electrodes are made in a same material layer and arranged not to overlap each other in an initial position,
wherein the first and the second capacitor comb-teeth electrodes are made in a layer different from said same material layer in which the first and the second driver comb-teeth electrodes are made, and
wherein the movable part is rotatable for varying an extent of the electrode teeth overlap between the first and the second driver comb-teeth electrodes.

2. The movable micro-device according to claim 1, wherein the first and the second driver comb-teeth electrodes are made in a same material layer of an electroconductive silicon material.

3. The movable micro-device according to claim 1, wherein the first and the second driver comb-teeth electrodes are formed simultaneously by a DRIE operation performed to the material layer.

4. The movable micro-device according to claim 1, wherein at least one of the first and the second capacitor comb-teeth electrodes contains a metal selected from a group consisting of Au, Ag, Cu and Al.

5. The movable micro-device according to claim 1, wherein at least one of the first and the second capacitor comb-teeth electrodes is formed by electroplating.

6. A movable micro-device comprising:
a movable part including a movable main portion, a first capacitor comb-teeth electrode and a first driver comb-teeth electrode, the first capacitor comb-teeth electrode having a plurality of electrode teeth extending from the movable main portion, the first driver comb-teeth electrode having a plurality of electrode teeth extending from the movable main portion;
a frame including a second capacitor comb-teeth electrode and a second driver comb-teeth electrode, the second capacitor comb-teeth electrode having a plurality of electrode teeth extending toward the first capacitor comb-teeth electrode, the second driver comb-teeth electrode having a plurality of electrode teeth extending toward the first driver comb-teeth electrode; and
a connecting part connecting the movable part and the frame to each other;
wherein the first and the second capacitor comb-teeth electrodes are made in a layer different from another layer in which the first and the second driver comb-teeth electrodes are made,
wherein the first and the second capacitor comb-teeth electrodes are made of a metal material and have electrode teeth overlap in an initial position,
wherein the first and the second driver comb-teeth electrodes are made of a metal material and arranged not to overlap each other in an initial position, and
wherein the movable part is rotatable for varying an extent of the electrode teeth overlap between the first and the second driver comb-teeth electrodes.

7. The movable micro-device according to claim 1 or 6, wherein the electrode teeth of the first driver comb-teeth electrode extend from the movable main portion on a side away from the electrode teeth of the first capacitor comb-teeth electrode.

8. The movable micro-device according to claim 1 or 6, wherein the electrode teeth of the first driver comb-teeth electrode extend from the movable main portion on a same side as the electrode teeth of the first capacitor comb-teeth electrode.

9. The movable micro-device according to claim 1 or 6, wherein the connecting part includes an electroconductive portion having electrical connection with the first capacitor comb-teeth electrode of the movable part.

10. The movable micro-device according to claim 1 or 6, wherein at least one of the first and the second capacitor comb-teeth electrodes has a surface provided with no dielectric film.

11. The movable micro-device according to claim 1 or 6, configured as a variable capacitor for varying an electrostatic capacity between the first and the second capacitor comb-teeth electrodes.

12. The movable micro-device according to claim 1 or 6, configured as a sensing device for detecting an electrostatic capacity between the first and the second capacitor comb-teeth electrodes.

13. The movable micro-device according to claim 1 or 6, packaged by using an electrically insulating liquid or an electrically insulating gas as a filler.

* * * * *